United States Patent
Faybishenko

(10) Patent No.: US 8,000,360 B2
(45) Date of Patent: Aug. 16, 2011

(54) LASER DIODE ASSEMBLIES

(76) Inventor: Victor Faybishenko, San Carlos, CA (US)

( * ) Notice: Subject to any disclaimer, the term of this patent is extended or adjusted under 35 U.S.C. 154(b) by 0 days.

(21) Appl. No.: 12/717,507

(22) Filed: Mar. 4, 2010

(65) Prior Publication Data

US 2010/0158060 A1  Jun. 24, 2010

Related U.S. Application Data

(63) Continuation of application No. 12/058,459, filed on Mar. 28, 2008, now Pat. No. 7,733,932.

(51) Int. Cl.
*H01S 3/04* (2006.01)
(52) U.S. Cl. .......................... 372/36; 372/98
(58) Field of Classification Search .................. 372/98, 372/36, 58, 34; 29/592.1; 362/50.121
See application file for complete search history.

(56) References Cited

U.S. PATENT DOCUMENTS

| | | | |
|---|---|---|---|
| 3,919,663 A | 11/1975 | Caruolo et al. |
| 4,499,582 A | 2/1985 | Karning et al. |
| 4,757,511 A | 7/1988 | Klingel et al. |
| 4,828,357 A | 5/1989 | Arata et al. |
| 5,168,401 A | 12/1992 | Endriz |
| 5,319,528 A | 6/1994 | Raven |
| 5,463,534 A | 10/1995 | Raven |
| 5,579,422 A | 11/1996 | Head et al. |
| 5,877,898 A | 3/1999 | Hollemann et al. |
| 5,987,043 A | 11/1999 | Brown et al. |
| 6,005,717 A | 12/1999 | Neuberger et al. |
| 6,044,096 A | 3/2000 | Wolak et al. |
| 6,229,831 B1 | 5/2001 | Nightingale et al. |
| 6,404,542 B1 | 6/2002 | Ziari et al. |
| 6,462,883 B1 | 10/2002 | Wang et al. |
| 6,556,352 B2 | 4/2003 | Wang et al. |
| 6,665,471 B1 | 12/2003 | Farmer et al. |
| 6,683,727 B1 | 1/2004 | Goring et al. |
| 6,898,222 B2 | 5/2005 | Hennig et al. |
| 7,075,739 B2 | 7/2006 | Mikhailov et al. |
| 7,199,924 B1 | 4/2007 | Brown et al. |
| 7,233,442 B1 | 6/2007 | Brown et al. |
| 7,420,996 B2 | 9/2008 | Schulte et al. |

(Continued)

FOREIGN PATENT DOCUMENTS

EP  1 788 678  11/2006

OTHER PUBLICATIONS

Fan, T.Y.; Sanchez, Antonio, "Pump Source Requirements for End-Pumped Lasers," IEEE Journal of Quantum Electronicx, vol. 26, No. 2, Feb. 1990, pp. 311-316.

*Primary Examiner* — Jessica T Stultz
*Assistant Examiner* — Tuan N Nguyen
(74) *Attorney, Agent, or Firm* — Michael Shenker; Haynes and Boone, LLP

(57) ABSTRACT

Laser diodes (120) emit laser beams along a vertical YZ plane at different distances from the YZ plane. The beams are collimated in their fast and slow axes, and are redirected by turning mirrors (162) to form a beam stack (130C) traveling along the XZ plane. The beam stack is turned by about 90°, then converged by a focusing lens (174) into an optical fiber (180). A compact assembly is thus provided. Each laser diode (120.i), its collimating optics (154.i, 158.i, i=1, 2, . . . ) and its turning mirror (162.i) are rigidly attached to a flat, heat-spreading surface (144.i) and thus remain aligned with each other in thermal cycling.

38 Claims, 5 Drawing Sheets

U.S. PATENT DOCUMENTS

| | | |
|---|---|---|
| 7,436,868 B2 | 10/2008 | Schulte et al. |
| 7,443,895 B2 | 10/2008 | Schulte et al. |
| 2003/0099267 A1 | 5/2003 | Hennig et al. |
| 2004/0114648 A1 | 6/2004 | Nagano et al. |
| 2007/0116070 A1 | 5/2007 | Schulte et al. |
| 2007/0116077 A1 | 5/2007 | Farmer et al. |
| 2008/0310027 A1 | 12/2008 | Wilson et al. |

LASER DIODE ASSEMBLIES

CROSS-REFERENCE TO RELATED APPLICATIONS

The present application is a continuation of U.S. patent application Ser. No. 12/058,459, filed 28 Mar. 2008 now U.S. Pat. No. 7,733,932, incorporated herein by reference.

BACKGROUND OF THE INVENTION

The present application is a continuation of U.S. patent application Ser. No. 12/058,459, filed 28 Mar. 2008, incorporated herein by reference.

The present invention relates to laser diode assemblies.

Laser diodes offer both high output power and a small footprint, making them good candidates for many applications including materials processing, medical devices, telecommunications, printing, and other uses. The output of the laser diode can be coupled to an optical fiber serving as a waveguide or providing a laser cavity for a fiber laser. The optical fiber's input surface is typically circular, while the laser diode's output beam is roughly an elongated rectangle. Therefore, direct coupling of the output beam into the fiber is inefficient, underutilizing the fiber's input area and hence the fiber's capacity for input brightness and power.

To increase the brightness and power coupled into the fiber, output beams of multiple laser diodes can be stacked above each other (i.e. with the long axes stacked above each other) to more closely approximate a circle. The long axis of a laser diode's emitter is called a "slow axis" due to low divergence of the beam along this axis. This axis is parallel to the diode's pn junction. The emitter' short axis, which is called a "fast axis" due to higher divergence of the beam along this axis, is perpendicular to the pn junction. For manufacturing convenience, the laser diodes can be manufactured in a single semiconductor structure in a laser diode bar configuration, with their slow axes positioned on a single line, and the beams can be placed into a stack using turning mirrors. See e.g. U.S. Pat. No. 6,044,096 issued Mar. 28, 2000 to Wolak et al. See also U.S. Pat. No. 6,898,222 issued May 24, 2005 to Hennig et al., describing another configuration in which the laser diodes' slow axes are not on a single line to form a stepped configuration.

Even minute misalignments between the laser diodes and the optical components (such as turning mirrors and the collimating and focusing optics) may reduce the coupling efficiency between the laser diodes and the optical fiber.

SUMMARY

This section summarizes some features of the invention. Other features are described in the subsequent sections. The invention is defined by the appended claims, which are incorporated into this section by reference.

Some embodiments of the present invention help reduce misalignments caused by heat and by mechanical pressures generated in attaching a laser diode assembly to other components, e.g. to a "cold plate" (a plate cooled via active cooling, e.g. by liquid or air or by a thermo-electric cooler).

In some embodiments of the present invention, each laser diode, its respective collimating optics, and its turning mirror are assembled on a flat, heat-dissipating surface. Such surface will be called "optical bench". The optical bench has a high heat conductivity, and thus is roughly at a uniform temperature. Heat is absorbed below the bench surfaces, so the temperature gradient is directed essentially downward. Consequently, each bench remains essentially flat and free of warpage, maintaining the angular orientation and vertical alignment between each laser diode and its respective collimating optics and turning mirror.

The inventor observed that the entire assembly of the laser diodes and the optics should preferably be symmetric to reduce mechanical and other deformations in any given direction. Mechanical deformations may occur when the assembly is attached to some base (e.g. a cold plate) with fasteners which apply mechanical forces at selected points. The mechanical forces may deform the assembly, e.g. causing a bow between the points of attachment. To limit the maximum bow, it is desirable for the points of attachment to be about equidistant from each other. It is also desirable to reduce the maximum distance between any point in the assembly and the closest point of attachment. This suggests a symmetric structure, e.g. with rotational symmetry. In particular, the assembly should preferably be approximately circular or square in top view.

Given this structure, it is also desirable to lengthen the beam path so as to reduce the numerical aperture (NA) of the combined beam (the beam stack) entering the optical fiber. The reduced NA increases the combined beam's brightness and also facilitates fitting the combined beam into the fiber's acceptance angle. In some embodiments, the beam path is increased by extending the beam along at least three sides of a square (or a rectangle) running along the assembly periphery. For example, in some embodiments, the laser diodes are positioned in a row along a "first side" of the square. In a Cartesian coordinate system with an X axis positioned along this first side, the laser diodes emit beams propagating along a YZ plane. Here X and Y are horizontal axes and Z is vertical. The Y axis provides the second side of the square path. The beams are collimated in their fast and slow axes as they travel along the YZ plane, i.e. along the second side. The collimating lenses are immediately followed by turning mirrors which turn the respective beams by about 90° to travel along the third side of the square. The beams are at different heights to form the beam stack. As soon as the beam stack is formed, i.e. immediately past the X coordinate of the last laser diode (or its submount), the beam stack hits another turning mirror. This turning mirror turns the beam stack by about 90° to travel along the square's fourth side. This turning mirror is immediately followed by a focusing optics that focuses the beam stack into the optical fiber's input. A highly compact structure is thus provided.

The invention is not limited to the features and advantages described above. Other features are described below. The invention is defined by the appended claims.

DESCRIPTION OF SOME EMBODIMENTS

The embodiments described in this section illustrate but do not limit the invention. The invention is defined by the appended claims.

Figure 1:
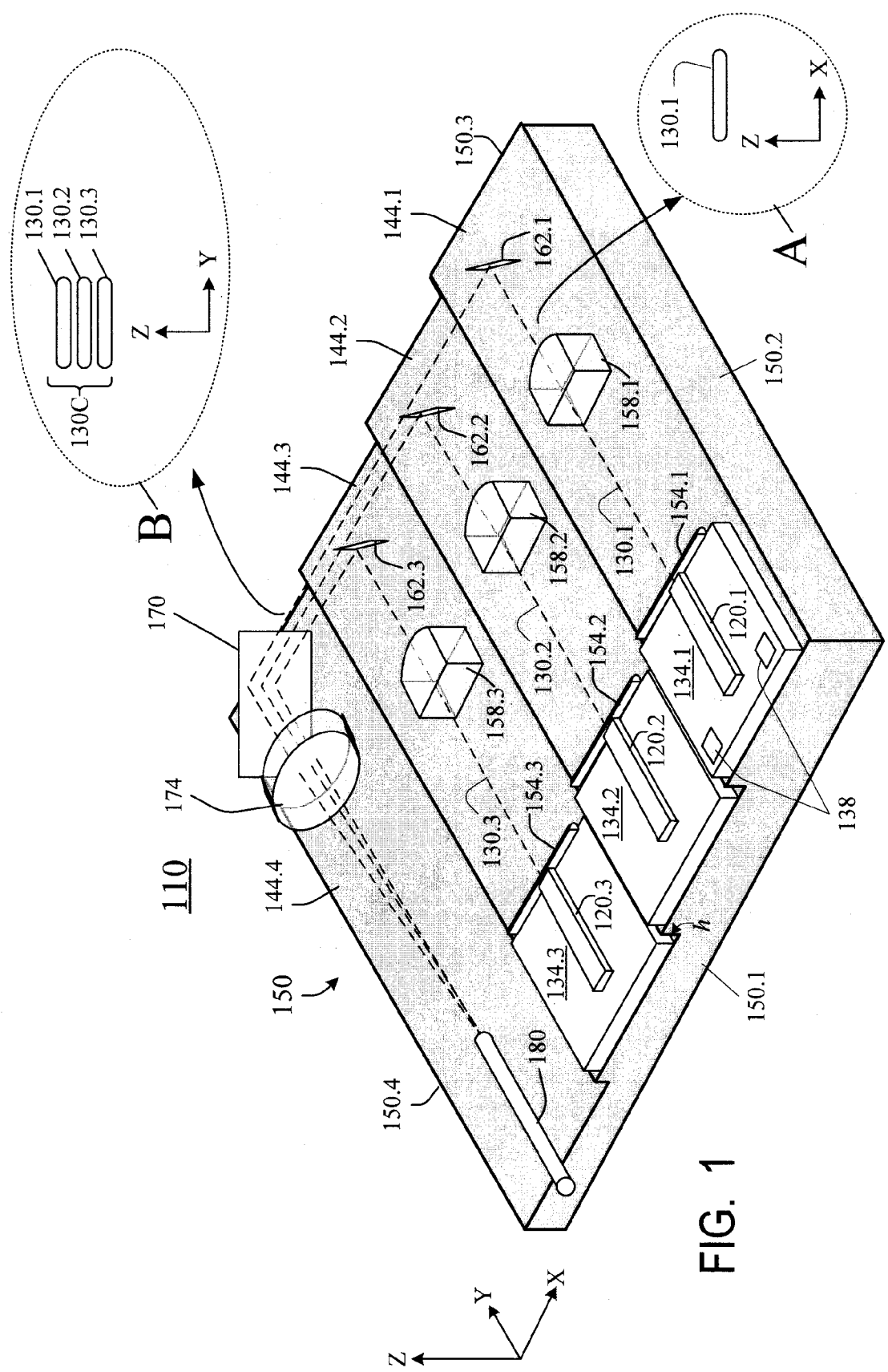
FIG. 1 is a perspective view of a laser diode assembly according to some embodiments of the present invention.
Figure 2:
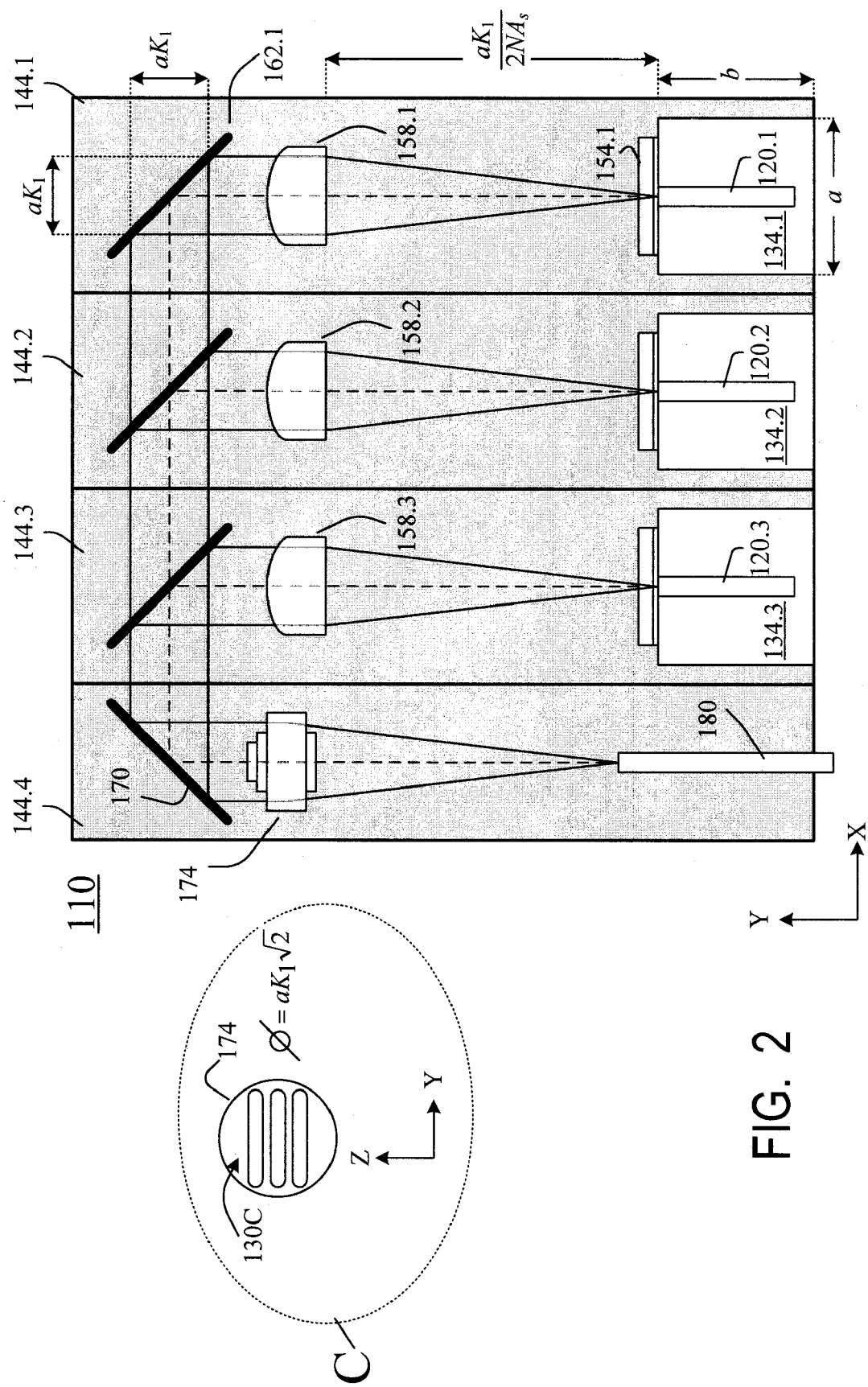
FIG. 2 is a top view of the assembly of FIG. 1.
Figure 3:
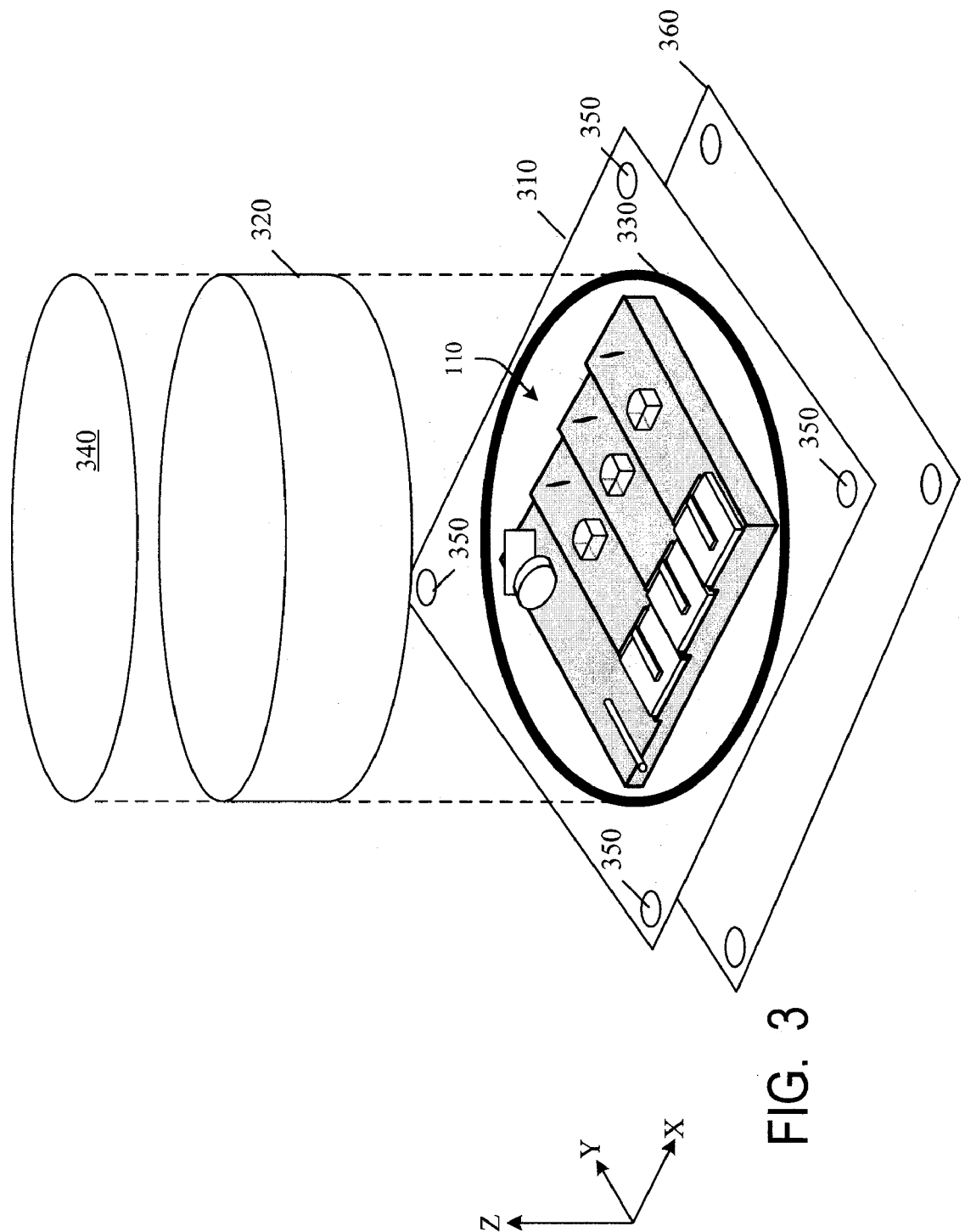
FIG. 3 is a perspective view of the assembly of FIG. 1 together with packaging elements.

FIG. 1 is a perspective view of a laser diode assembly 110 according to some embodiments of the present invention. FIG. 2 is a top view of the assembly. FIG. 3 is a perspective view of assembly 110 with packaging used in some embodiments. The assembly will be described with reference to a Cartesian coordinate system XYZ where X and Y are horizontal axes and Z is vertical. However, the invention is not limited by any coordinate system, and further the assembly 110 can be oriented and operated in any position.

Assembly 110 includes three laser diodes 120.1, 120.2, 120.3 laterally spaced from each other in the X direction. Any number of diodes can be present. In this embodiment, each diode 120.i (i=1, 2, 3) is a single-emitter diode, formed in a discrete semiconductor structure, but this is not necessary for the invention. Diodes 120 have horizontal pn junctions. Each diode 120.i emits respective light beam 130.i (i=1, 2, 3) in the Y direction. The beams' slow axes are parallel to the X axis, and the fast axes are parallel to the Z axis.

Each diode 120.i (i=1, 2, 3) is mounted on a respective submount 134.i in chip-on-submount (CoS) configuration. Each submount 134.i has high thermal conductivity, and can be dielectric or it can be conductive but electrically insulated from diode 120.i. Suitable materials for submounts 134.i include ceramic materials common in semiconductor packaging, for example Beryllia Ceramic or Aluminum Nitride used in CoS structures available from Bookham, Lumics, INNOLUME and others semiconductor laser diode suppliers. These examples are not limiting. The submounts 134 (i.e. 134.1, 134.2, 134.3) provide first level packaging for the diode chips, and can be replaced with other types of packaging, whether known or to be invented. Each submount 134.i includes electrical contacts (not shown) connected to the p and n type regions of the diode. These contacts connect the diode's p and n doped regions to the respective two contact pads 138 provided on each submount 134.i (contact pads 138 are shown only for submount 134.1 for simplicity). In operation, a voltage is provided across the two pads 138 to cause light emission by the respective diode.

Each submount 134.i is placed onto a respective optical bench 144.i which has high thermal conductivity. In the embodiment being described, the benches 144.i (i=1, 2, 3) are flat horizontal surfaces of a one-piece carrier 150 which can be made, for example, of copper or some other metal or non-metal material having high thermal conductivity. The submounts 134 are attached to benches 144 in a thermally conductive manner, e.g. by thermally conductive adhesive such as a suitable epoxy, or by thermocompression, fasteners, and/or other means; to make benches 144 effective in dissipating heat generated by the diodes. The submounts are located at a side 150.1 of carrier 150. The carrier is square in top view, with sides 150.1, 150.2, 150.3, 150.4. The opposite sides 150.1, 150.3 are parallel to the XZ plane. The opposite sides 150.2, 150.4 are parallel to the YZ plane. In other embodiments, the carrier 150 is rectangular but not square. Non-rectangular carriers can also be used. For example, the carrier may have chamfered corners, or be circular, or of some other shape.

The benches 144.1, 144.2, 144.3 are positioned at different heights. The bench 144.1 is stepped up by some distance h relative to bench 144.2, and the bench 144.2 is stepped up by distance h or some other distance relative to bench 144.3.

A collimating lens 154.i (i=1, 2, 3) is attached to the respective optical bench 144.i in front of the emitter of the respective diode 120.i to collimate the diode's output beam 130.i along the fast axis. Another collimating lens 158.i is attached to bench 144.i farther down the beam's path to collimate the beam along the slow axis. The beam's optical axis is a straight or nearly straight line passing through the respective collimators 154.i, 158.i to the respective turning mirror 162.i parallel to the Y axis. An insert A shows a collimated beam's cross section parallel to the XZ plane for beam 130.1 at the beam's exit from lens 158.1. The other beams can have the same shape.

Each turning mirror 162.i (i=1, 2, 3) is a vertical mirror attached to the respective bench 144.i near the carrier side 150.3 at an angle of about 45° to each of the Y and X axes, to turn the respective beam 130.i by about 90° (85° to 95° in some embodiments). The optical elements 154, 158, 162 are attached to benches 144 with an adhesive (e.g. epoxy) or some other means. Due to high conductivity of carrier 150, each bench's temperature is highly uniform across the bench, and the bench remains highly flat in thermal cycling. Therefore, the vertical alignment between each diode 120.i and its respective optical elements 154.i, 158.i, 162.i is highly stable.

After reflection from mirror 162.i, each beam 130.i travels parallel to the X axis. Beam 130.1 passes above mirror 162.2 due the bench 144.1 being higher (by distance h) than bench 144.2. Beams 130.1, 130.2 pass above mirror 162.3 for a similar reason. As beam 130.1 passes above each mirror 162.2, 162.3, the beam 130.1 is joined by respective beams 130.2, 130.3 to form a beam stack 130C, whose cross section parallel to the XY plane is shown in insert B. The individual beams 130.i overlie one another in the combined beam 130C, with their slow axes being horizontal and overlying one another. In some embodiments, the slow axes have the same length and are aligned so that each upper axis is precisely above each lower axis. In other embodiments, this precise alignment is absent, and further the slow axes may differ in length. In some embodiments, the combined beam 130C has a square outline, but non-square outlines are also possible. In some embodiments, the beams 130.i are placed as close to each other as possible to reduce the numerical aperture of the combined beam to obtain higher brightness.

The combined beam 130C is reflected by a vertical turning mirror 170 by about 90° (85° to 95° in some embodiments). Mirror 170 is attached to carrier 150 near the side 150.4 at an angle of about 45° to each of the YZ plane. After reflection from mirror 170, beam 130C travels along the Y axis and enters focusing lens 174. Lens 174 converges the combined beam. After exiting the lens 174, the combined beam keeps traveling essentially along the Y axis into optical fiber 180. The focal distance of focusing lens 174 is chosen to fit the beam 130C into a numerical aperture not exceeding the NA of fiber 180.

In FIG. 1, the optic elements 170, 174, 180 are attached to a separate optical bench 144.4 of carrier 150. Bench 144.4 is below bench 144.3 to align the beam 130C emerging from mirror 170 with the middle portion of the input surface of lens 174. Lens 174 has a circular cross section enclosing the square outline of beam 130C entering the lens. Fiber 180 is mounted on bench 144.4 in a raised position so that the centers of fiber 180 and lens 174 are at the same height. In other embodiments, bench 144.4 is level with bench 144.3 (i.e. the two benches are merged into a single flat surface). In such configuration, lens 174 can be lowered into a groove in bench 144.4 to align the lens with beam 130C, and/or lens does not have to be circular, and/or the beams 130.i can be caused to rise upward on the way to lens 174 by tilting the mirrors 162 and/or 170 by suitable angles. Other arrangements are also possible.

Optics 170, 174, 180 can be attached to carrier 150 by the same methods as optics 154, 158, 162, or by some other techniques.

FIG. 2 (top view) illustrates dimensions obtained in some embodiments of assembly 110. In these embodiments, each carrier 134.i is rectangular in top view, with the X and Y dimensions denoted as a and b respectively. The distance between the adjacent carriers 134.i is small, and assumed to be zero for the computation immediately below. The maximum length of each beam 130.i along the slow axis is reached at the entrance of lens 158.i, and should not exceed a to ensure that the adjacent beams do not overlap. (The beams could overlap, but they do not in the present embodiment.) The maximum length at the entrance of each lens 158.i can be smaller than a, and is set to $aK_1$ where $K_1 \leq 1$ is a safety factor chosen to accommodate manufacturing and operational tolerances. In some embodiments, $K_1$ is at least ½, but can be any number. The beam's length from the emitter of diode 120.i to the entrance of lens 158.i is therefore about $aK_1/[2NA_S]$, where $NA_S$ is the beam's numerical aperture along the slow axis.

As seen from FIG. 2, the length of assembly 110 along the Y axis is about $$b+aK_1/[2NA_S]+aK_1 \quad (1)$$

Along the X axis, the length of assembly 110 is about 3a plus the diameter of focusing lens 174. If there are N diodes, 3a should be replaced by Na. The diameter of lens 174 should be at least the length of the diagonal of the square beam 130C as shown in insert C. The square has a side of $aK_1$, so the diameter is $aK_1\sqrt{2}$. The total length along the Y axis for an N diode assembly is therefore about $$Na+aK_1\sqrt{2} \quad (2)$$

The height of the structure is about the diameter of length 174, i.e.

$$aK_1\sqrt{2} \quad (3)$$

The step h (FIG. 1) is chosen so that the individual beams 130.i do not overlap in the combined beam 130C. The overlap could cause brightness and power loss, but the overlap is acceptable in some embodiments. If there is no overlap, the height of each beam 130.i in combined beam 130C is given by the following equation:

$$\text{height of bean } 130.i = F_f/2NA_f \quad (4)$$

where $F_f$ is the focal distance of each lens 154.i and $NA_f$ is each beam's numerical aperture along the fast axis. The step h is chosen as equal or slightly above the height of beam 130.i, i.e.

$$h = K_2 \cdot F_f/2NA_f \quad (5)$$

where $K_2$ is a safety factor, possibly a value from 1 to 3 inclusive.

To make the assembly square or near square, the X and Y dimensions (1) and (2) should be about equal. Setting (1) equal to (2) and solving for N, one can obtain a suitable range for the number of diodes based on the values a, b, $NA_S$ and $K_1$. In some embodiments, the number N is in the range of 2 to 6 inclusive. This range is not limiting.

Further, multiple diodes can be manufactured in a single chip. For example, each diode 120.i can be replaced by a laser diode bar. In one assembly 110, different diodes may generate different wavelengths, e.g. to generate colors by combining the wavelengths of different diodes.

During the assembly, each diode 120.i and its lenses 154.i, 158.i are aligned separately for each i using a far field camera. Optical fiber 180 and focusing lens 174 are aligned together using a far field camera and a light source in the far field. Then mirrors 162 are placed and aligned. Then mirror 170 is placed and aligned. Also, an additional structure (not shown) can be provided to carry a pair of common terminals (not shown) one of which is electrically coupled to one of contacts 138 on each carrier 134.i to provide a positive voltage to the diodes. The other common terminal is electrically coupled to the other one of contacts 138 on each carrier 134.i to provide a negative voltage to the diodes. This is an exemplary, not limiting arrangement, in which the diodes are interconnected in parallel. The diodes can alternatively be connected in series, or not interconnected at all (e.g. to provide independently controlled electric currents through different diodes of different wavelengths to generate multi-color images). The invention is not limited to any electrical interconnections.

FIG. 3 illustrates suitable packaging for assembly 110. When the assembly 110 has been manufactured, carrier 150 is placed on the flat, middle portion of a base plate 310 made of a material having high thermal conductivity and low thermal deformation. Known copper alloys can be used for this purpose. Carrier 150 is attached to base plate 310 in a thermally conductive manner, e.g. by epoxy, thermocompression, or possibly other means. In some embodiments, base 310 is square or circular. Cylindrical housing 320 is fitted into a groove 330 made in the top surface of base plate 310 around the position of the assembly 110. Cylindrical housing 320 is rigidly fixed in the groove (with adhesive for example). Housing 320 includes an aperture (not shown) for fiber 180 and one or two apertures (not shown) for the common terminals coupled to the contacts 138. One end of fiber 180 is threaded outward through its respective aperture and is lengthened by attachment to another fiber of a desired length. Electrical wires are threaded in through the respective apertures and attached to the respective common terminals. The assembly is tested, and then a lid 340 is attached to the top of housing 320 to provide a protective seal.

Base plate 310 has threaded holes 350 at its corners or at some other places so that the adjacent holes 350 are about equidistant from each other. Screws (not shown) are threaded through holes 350 to attach the base plate to a cold plate 360 which can be actively cooled, for example by liquid, air, a thermo-electric cooler.

Figure 4:
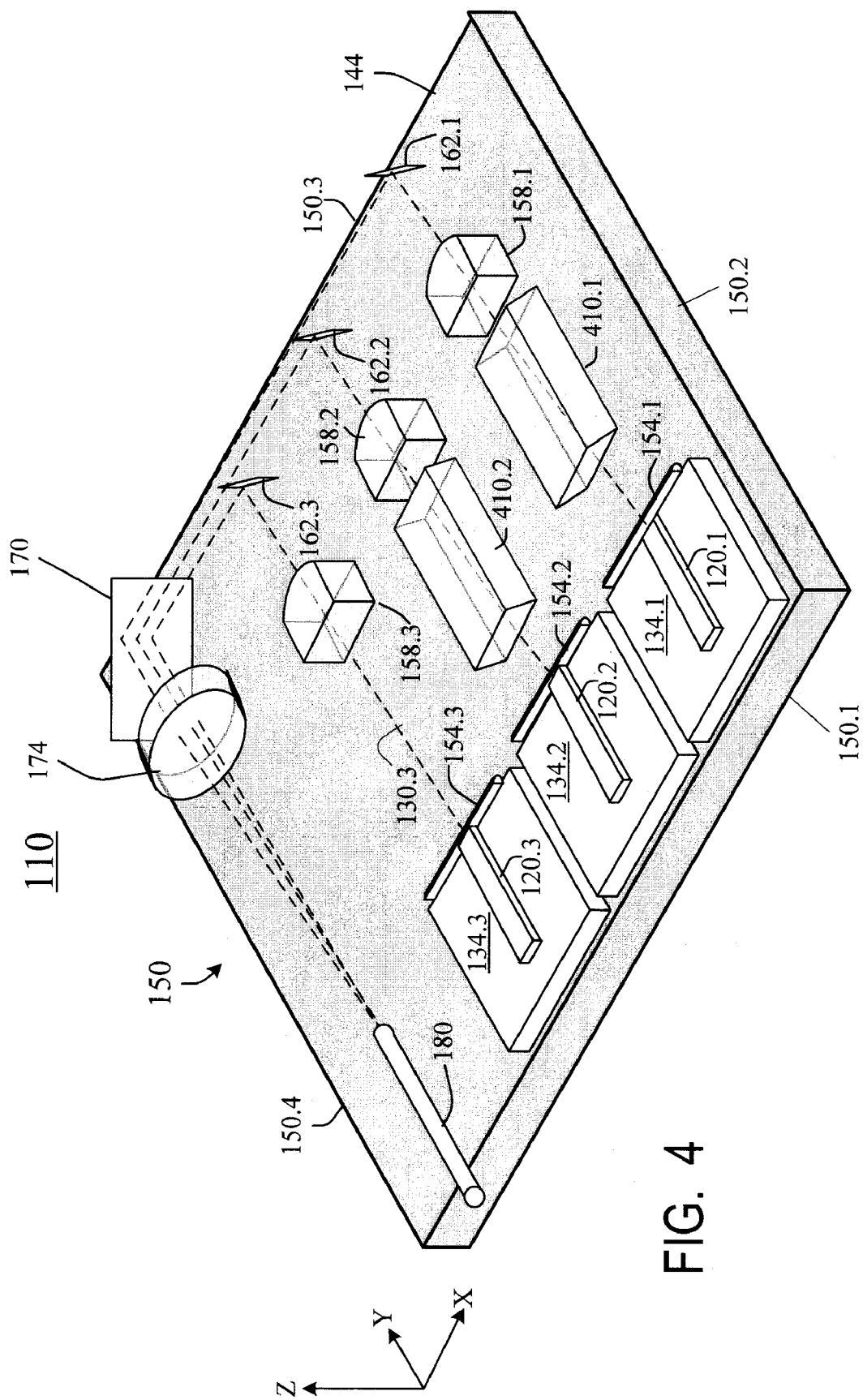
FIG. 4 is a perspective view of a laser diode assembly according to some embodiments of the present invention.

FIG. 4 shows another embodiment of diode assembly 110. This embodiment is similar to the embodiment of FIG. 1 but the optical benches 144.i are level with each other, i.e. are merged into a single horizontal surface 144 at the top of carrier 150. The emitters of diodes 120 are all at the same height, but optical prisms 410.i (i=1, 2) with angled edges are placed between respective fast axis collimators (FAC) 154.i and slow axis collimators (SAC) 158.i to shift up the respective beam 130.i by the desired height (e.g. height 2h for beam 130.1, height h for beam 130.2). Therefore, the three beams 130.i reach the respective mirrors 162.i at different heights, possibly the same heights as in FIG. 1. Mirrors 162 are mounted at respective different heights, possibly the same respective heights as in FIG. 1, on appropriate submounts (not shown). Alternatively, the mirrors can be mounted directly on surface 144 at the same height, but mirror 162.1 can be made taller than mirror 162.2, and mirror 162.2 can be made taller than mirror 161.1. Beam 130.3 can also be shifted up with a prism or other optics by a suitable amount. Other optic arrangements are also possible. In still other embodiments with or without a single horizontal surface 144, the prisms 410.i may be omitted and/or the beams may reach the mirrors 162 at the same height but may be directed upward at respective different angles by means of the mirrors 162 (if the mirrors are not vertical for example) or by other optics so that the beams 130.i remain separate. In other embodiments, the beams are merged together at least partially.

The remaining features can be as in any of the embodiments described above in connection with FIG. 1 (e.g. multiple-emitter diodes can be used, any number of diodes can be present, etc.).

In some variations of FIG. 1, two or more but less than all of benches 144.i are merged together. Suitable optics control the height of each beam 130.i at the entrance of the respective mirror 162.i.

Figure 6:
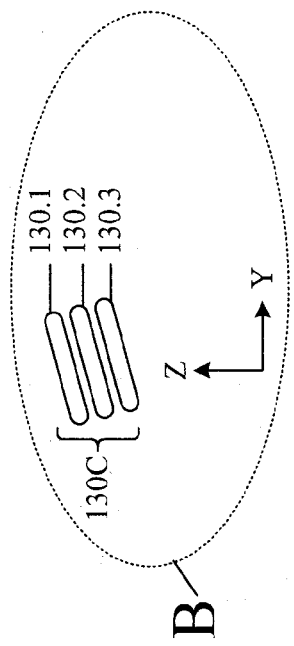
FIGS. 6, 7, 8 illustrate cross sections of laser beams in some embodiments of the present invention.
Figure 5:
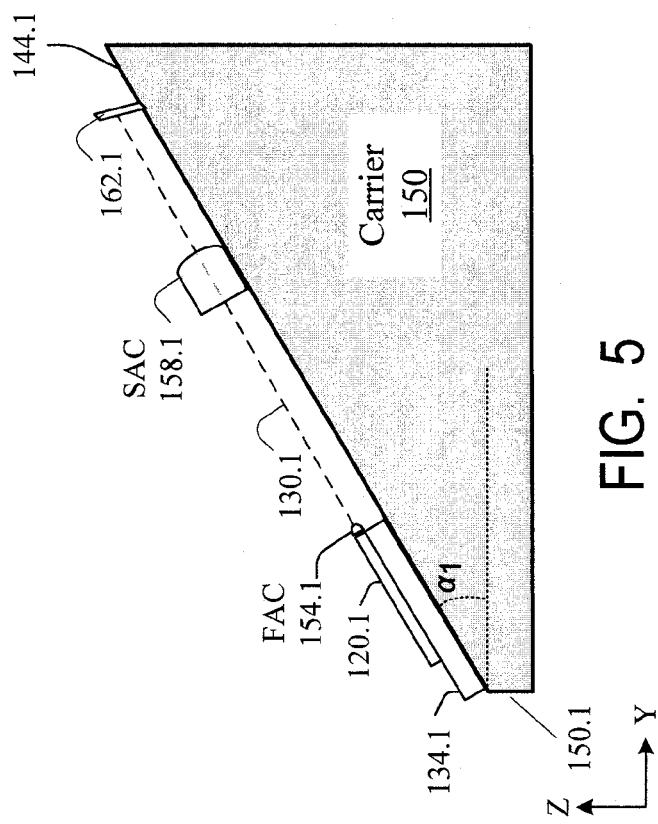
FIG. 5 is a side view of a laser diode assembly according to some embodiments of the present invention.

In FIG. 5, each bench 144.i (i=1, 2, ..., N) is inclined at an angle $\alpha_i$ relative to the horizontal plane, where $a_1 > a_2 > \ldots > a_N \geq 0$. In some embodiments, $a_i = a_N \cdot (N-i+1)$. Lenses 154.i, 158.i and mirror 162.i are attached to the optical bench 144.i in the same positions relative to the bench as in FIG. 1. Different mirrors 162.i are at different heights due to the different inclination angles $a_i$. The angles and the positions and shapes of mirrors 162 are chosen to provide a combined beam 130C as in insert B in FIG. 1 or 6. In FIG. 6, the combined beam 130C is as in FIG. 1 but is rotated by some angle having a value at least $a_N$ and at most $a_1$. The angles $a_i$ can be chosen so that at the distance provided by equation (1) above and measured from the bottom of surfaces 144.i, the adjacent beams are vertically shifted by the h value of equation (5) relative to each other. The value $a_1$ is then about $$a_1 = h/L$$

where L is given by (1).

Figure 8:
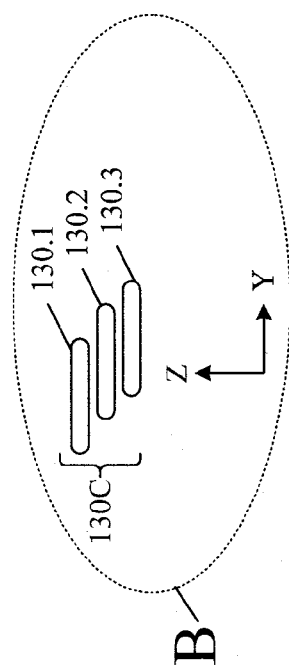
Figure 7:
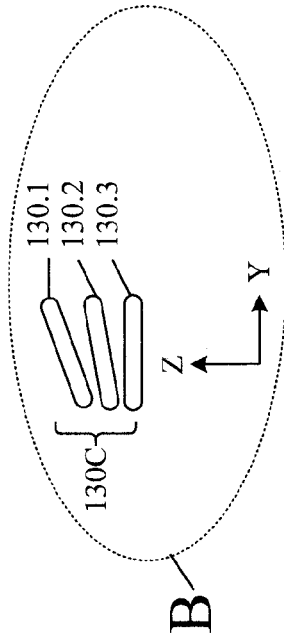

The slow axes of beams 130.i may be non-horizontal as in FIGS. 6, 7, and/or may not be parallel to each other as in FIG. 7, and/or may be shifted relative to each other along their slow axes, e.g. may overlap only partially when projected onto a horizontal plane (FIG. 8).

Some embodiments provide an apparatus disposed in a region having a plurality of vertical sides comprising at least a first side, a second side, a third side, and a fourth side. For example, in FIG. 1, the region containing the assembly 110 may be defined as enclosed by the first, second, third, and fourth sides which include the respective sides 150.1, 150.2, 150.3, 150.4. Alternatively, the region may be defined as having more than four sides, e.g. the assembly 110 may be enclosed into a pentagonal region. In any case, each of the second and fourth sides is between the first side and the third side, and each of the first and third sides is between the second side and the fourth side. The apparatus, and hence the region, contains a plurality of laser diodes arranged to emit laser beams into the region in a direction or directions away from the first side (e.g. away from side 150.1 in FIG. 1, 4 or 5), wherein the laser diodes' emitters are at different distances from at least one of the second and fourth sides (e.g. from side 150.2 and/or 150.4 in FIG. 1). Each laser beam may be a continuous beam (as in insert A of FIG. 1), or may be a combined discontinuous beam of multiple laser diodes, e.g. of two or more diodes of a laser diode bar. Each beam includes a continuous or discontinuous slow axis. The apparatus further comprises optics for directing the laser beams to an output window. The output window may or may not be an input of an optical fiber. The optics comprises collimator optics (e.g. 154.1, 154.2, 154.3, 158.1, 158.2, 158.3) for collimating the laser beams. Also, a first beam-redirector is provided (e.g. 162.1, 162.2, 162.3) for directing the collimated beams to travel adjacent to the third side with the beams' slow axes overlying one another in a vertical cross section transverse to the beams (e.g. as in insert B in FIG. 1). A second beam-redirector (e.g. 170) directs the beams received from the first beam-redirector to travel adjacent to the fourth side. Focusing optics (e.g. 174) converges the beams traveling from the second redirector to the output window.

In some embodiments, the first side is at an angle of 71° to 109° to the second side, the second side is at an angle of 71° to 109° to the third side, the third side is at an angle of 71° to 109° to the fourth side, and the fourth side is at an angle of 71° to 109° to the first side.

In some embodiments, the region is rectangular in top view, with a ratio of lengths of any two adjacent sides being at least 0.7 and at most 1.45.

In some embodiments, the laser diodes and the optics are arranged to keep the beams separate from each other (i.e. the beams do not merge) at least between the laser diodes and the first beam-redirector.

In some embodiments, in a first cross section parallel to the first side and located at an entrance to the first beam-redirector (e.g. in a vertical cross section right before the mirrors 162), the beams' slow axes do not overlie one another. Alternatively, at least some of the beams' slow axes may overlie one another but do not overlap as much as at the exit from the first beam-redirector. The first beam-redirector thus increases the beam overlap. For example, in FIG. 1, the beam positions at the exit of mirrors 162 (the exit of mirror 162.3) is illustrated in insert B. The overlap between any two slow axes can be measured in an orthogonal projection of one of the slow axes onto the other. Mirrors 162 increase the overlaps.

Some embodiments comprise a plurality of laser diode structures, each laser diode structure comprising a discrete semiconductor structure comprising one or more of said laser diodes. For example, a discrete semiconductor structure can be a laser diode bar. Further, a plurality of generally flat, heat-dissipating surface regions is provided (e.g. optical benches 144.i) for dissipating heat generated by the laser diodes, each laser diode structure being rigidly attached to a corresponding one of the flat, heat dissipating surface regions. Each laser diode structure is associated with a portion of the collimating optics and the first beam-redirector for collimating and directing the beam or beams emitted by the laser diode structure, the portion being rigidly attached to the corresponding flat, heat-dissipating surface region, wherein the portions being spaced from each other.

The invention is not limited to the features and advantages described above except as defined by the appended claims. Other embodiments and variations are within the scope of the invention, as defined by the appended claims.

The invention claimed is:

1. An apparatus comprising:
   (1) a thermally dissipative body comprising a top surface comprising a plurality of heat-dissipating surface regions;
   (2) a plurality of laser diode structures, each laser diode structure comprising a discrete semiconductor structure comprising one or more laser diodes, the laser diode structures being separate from each other;
   wherein each said laser diode structure overlies, and is rigidly attached to, a respective one of the heat-dissipating surface regions, and each laser diode structure's attachment to the top surface is confined to the respective heat-dissipating surface region and is separate from the attachment of every other one of the laser diode structures to the top surface;
   wherein each said laser diode structure's one or more laser diodes are positioned to emit one or more laser beams above the top surface;
   (3) fast-axis collimator optics for collimating the laser beams emitted by the laser diode structures;
   (4) slow-axis collimator optics comprising, for each said laser diode structure, one or more slow-axis collimators for collimating the one or more laser beams emitted by the laser diode structure, wherein the one or more slow-axis collimators of each laser diode structure are separate from the one or more slow-axis collimators of every other laser diode structure;

wherein for each laser diode structure, the corresponding one or more slow-axis collimators overlie, and are rigidly attached to, the laser diode structure's heat-dissipating surface region, and the one or more slow-axis collimators' attachment to the top surface is confined to the respective heat-dissipating surface region and is separate from the attachment of every other slow-axis collimator to the top surface;

(5) a first beam-redirector comprising, for each said laser diode structure, a first beam-redirector portion for redirecting one or more collimated laser beams which are emitted by the laser diode structure and collimated by the fast-axis collimator optics and the laser diode structure's one or more slow-axis collimators, wherein the first beam-redirector portions are separate from each other;

wherein the first beam-redirector reduces a lateral spread of slow axes of the collimated laser beams in a vertical cross section perpendicular to an optical axis of at least one collimated laser beam, wherein in at least one vertical cross section perpendicular to the optical axis of at least one collimated laser beam redirected by the first beam-redirector, the slow axes of the collimated laser beams redirected by the first beam-redirector spread laterally and overlie one another;

wherein for each laser diode structure, the corresponding first beam-redirector portion overlies, and is rigidly attached to, the laser diode structure's heat-dissipating surface region, and the first beam-redirector portion's attachment to the top surface is confined to the respective heat-dissipating surface region and is separate from the attachment of every other first beam-redirector portion to the top surface;

wherein all said attachments to the top surface are thermally dissipative for the thermally-dissipative body to dissipate heat generated by the laser diodes, the fast-axis and slow-axis collimator optics, and the first-beam redirector.

2. The apparatus of claim 1 wherein the thermally-dissipative body is for conducting heat downward from the top surface to an active cooler.

3. The apparatus of claim 2 in combination with the active cooler attached to the body below the body.

4. The apparatus of claim 1 wherein at least one said attachment uses a submount and/or adhesive.

5. The apparatus of claim 1 wherein the fast-axis collimator optics comprises, for each said laser diode structure, one or more fast-axis collimators for collimating the laser beams emitted by the laser diode structure, wherein the one or more fast-axis collimators of each laser diode structure are separate from the one or more fast-axis collimators of every other laser diode structure;

wherein for each said laser diode structure, the corresponding one or more fast-axis collimators overlie, and are rigidly attached to, the laser diode structure's heat-dissipating surface region, and the one or more fast-axis collimators' attachment to the top surface is thermally dissipative and is confined to the respective heat-dissipating surface region and is separate from the attachment of every other fast-axis collimator to the top surface.

6. The apparatus of claim 1 wherein the laser diodes, the fast-axis and slow-axis collimator optics, and the first beam-redirector are arranged to keep the laser beams separate from each other at least between the laser diodes and the first beam-redirector.

7. The apparatus of claim 1 wherein the laser diodes, the fast-axis and slow-axis collimator optics, and the first beam-redirector are arranged to keep the laser beams separate from each other at least between the laser diodes and an output of the first beam-redirector.

8. The apparatus of claim 1 wherein the first beam redirector is arranged to turn each collimated beam by an angle of 71° to 109° when viewed from the top.

9. A method for manufacturing the apparatus of claim 1, the method comprising assembling together the body, the laser diode structures, the fast-axis and slow-axis collimator optics, and the first beam redirector.

10. A method for operating an apparatus which comprises:
(1) a thermally dissipative body comprising a top surface comprising a plurality of heat-dissipating surface regions;
(2) a plurality of laser diode structures, each laser diode structure comprising a discrete semiconductor structure comprising one or more laser diodes, the laser diode structures being separate from each other;

wherein each said laser diode structure overlies, and is rigidly attached to, a respective one of the heat-dissipating surface regions, and each laser diode structure's attachment to the top surface is confined to the respective heat-dissipating surface region and is separate from the attachment of every other one of the laser diode structures to the top surface;

wherein each said laser diode structure's one or more laser diodes are positioned to emit one or more laser beams above the top surface;

(3) fast-axis collimator optics for collimating the laser beams emitted by the laser diode structures;
(4) slow-axis collimator optics comprising, for each said laser diode structure, one or more slow-axis collimators for collimating the one or more laser beams emitted by the laser diode structure, wherein the one or more slow-axis collimators of each laser diode structure are separate from the one or more slow-axis collimators of every other laser diode structure;

wherein for each laser diode structure, the corresponding one or more slow-axis collimators overlie, and are rigidly attached to, the laser diode structure's heat-dissipating surface region, and the one or more slow-axis collimators' attachment to the top surface is confined to the respective heat-dissipating surface region and is separate from the attachment of every other slow-axis collimator to the top surface;

(5) a first beam-redirector comprising, for each said laser diode structure, a first beam-redirector portion for redirecting one or more collimated laser beams which are emitted by the laser diode structure and collimated by the fast-axis collimator optics and the laser diode structure's one or more slow-axis collimators, wherein the first beam-redirector portions are separate from each other;

wherein the first beam-redirector reduces a lateral spread of slow axes of the collimated laser beams in a vertical cross section perpendicular to an optical axis of at least one collimated laser beam, wherein in at least one vertical cross section perpendicular to the optical axis of at least one collimated laser beam redirected by the first beam-redirector, the slow axes of the collimated laser beams redirected by the first beam-redirector spread laterally and overlie one another;

wherein for each laser diode structure, the corresponding first beam-redirector portion overlies, and is rigidly attached to, the laser diode structure's heat-dissipating surface region, and the first beam-redirector portion's attachment to the top surface is confined to the respective heat-dissipating surface region and is separate from the attachment of every other first beam-redirector portion to the top surface;

wherein all said attachments to the top surface are thermally dissipative for the thermally-dissipative body to dissipate heat generated by the laser diodes, the fast-axis and slow-axis collimator optics, and the first-beam redirector;

the method comprising:

emitting the laser beams by the laser diodes; and actively cooling the body's region located below the top surface to cause downward heat conduction from the top surface to the body's region.

11. An apparatus comprising:

a plurality of laser diode structures, each laser diode structure comprising a discrete semiconductor structure comprising one or more laser diodes;

a plurality of heat-dissipating surface regions for dissipating heat generated by the laser diodes, each laser diode structure being rigidly attached to a corresponding one of the heat-dissipating surface regions, wherein in each pair of the heat-dissipating surface regions, one of the heat-dissipating surface regions of the pair is either higher or lower than the other one of the heat-dissipating surface regions of the pair;

for each said laser diode structure, one or more collimators for collimating one or more laser beams emitted by the one or more diodes of the laser diode structure;

a first beam-redirector comprising, for each said laser diode structure, a first beam-redirector portion for redirecting the one or more collimated laser beams, the first beam-redirector being for positioning the beams with their slow axes overlying each other;

wherein for each laser diode structure, its first beam-redirector portion overlies, and is rigidly attached to, the corresponding heat-dissipating surface region but does not overlie any other one of the heat-dissipating surface regions.

12. The apparatus of claim 11 wherein for each laser diode structure, each of the corresponding one or more collimators is rigidly attached to the corresponding heat-dissipating surface region but does not overlie any other one of the heat-dissipating surface regions.

13. The apparatus of claim 11 wherein the heat-dissipating surface regions are arranged to thermally communicate with an active cooler arranged for conducting heat downward from the heat-dissipating surface regions.

14. The apparatus of claim 13 in combination with the active cooler positioned below the heat-dissipating surface regions.

15. The apparatus of claim 11 wherein the one or more collimators comprise, for each said laser diode structure, one or more slow-axis collimators for collimating the laser beams emitted by the laser diode structure, wherein the one or more slow-axis collimators of each laser diode structure are separate from the one or more slow-axis collimators of every other laser diode structure;

wherein for each said laser diode structure, the corresponding one or more slow-axis collimators overlie, and are rigidly attached to, the laser diode structure's heat-dissipating surface region.

16. The apparatus of claim 11 wherein the laser diodes, the collimators, and the first beam-redirector are arranged to keep the laser beams separate from each other at least between the laser diodes and the first beam-redirector.

17. The apparatus of claim 11 wherein the laser diodes, the collimators, and the first beam-redirector are arranged to keep the laser beams separate from each other at least between the laser diodes and an output of the first beam-redirector.

18. The apparatus of claim 11 wherein the first beam redirector is arranged to turn each collimated beam by an angle of 71° to 109° when viewed from the top.

19. A method for manufacturing the apparatus of claim 11, the method comprising assembling together the heat-dissipating surface regions, the laser diode structures, the collimators, and the first beam redirector.

20. A method for operating an apparatus which comprises:

a plurality of laser diode structures, each laser diode structure comprising a discrete semiconductor structure comprising one or more laser diodes;

a plurality of heat-dissipating surface regions for dissipating heat generated by the laser diodes, each laser diode structure being rigidly attached to a corresponding one of the heat-dissipating surface regions, wherein in each pair of heat-dissipating surface regions, one of the heat-dissipating surface regions of the pair is either higher or lower than the other one of the heat-dissipating surface regions of the pair;

for each said laser diode structure, one or more collimators for collimating one or more laser beams emitted by the one or more diodes of the laser diode structure;

a first beam-redirector comprising, for each said laser diode structure, a first beam-redirector portion for redirecting the one or more collimated laser beams, the first beam-redirector being for positioning the beams with their slow axes overlying each other;

wherein for each laser diode structure, its first beam-redirector portion overlies, and is rigidly attached to, the corresponding heat-dissipating surface region but does not overlie any other one of the heat-dissipating surface regions;

the method comprising:

emitting the laser beams by the laser diodes; and actively cooling a first region located below the heat-dissipating surface regions to cause downward heat conduction from the heat-dissipating surface regions.

21. An apparatus disposed in a region having a plurality of vertical sides comprising at least a first side, a second side, a third side, and a fourth side, wherein each of the second and fourth sides is between the first side and the third side, and each of the first and third sides is between the second side and the fourth side, the apparatus comprising:

(1) a plurality of laser diodes arranged to emit laser beams into the region in a direction or directions away from the first side, wherein the laser diodes' emitters are at different distances from at least one of the second and fourth sides; and (2) optics for directing the laser beams to an output window, the optics comprising:

(2a) collimator optics for collimating the laser beams;

(2b) a first beam-redirector for directing the collimated beams to travel adjacent to the third side with the beams' slow axes overlying one another in a vertical cross section transverse to the beams;

(2c) a second beam-redirector for directing the beams received from the first beam-redirector to travel adjacent to the fourth side; and (2d) focusing optics for converging the beams traveling from the second redirector to the output window;

wherein in a first cross section parallel to the first side and located at an entrance to the first beam-redirector, the beams' slow axes do not overlie one another or, if any slow axes overlie one another, an overlap between such slow axes is smaller than at an exit from the first beam-redirector in a second cross section orthogonal to the third side.

22. The apparatus of claim 21 wherein the first side is at an angle of 71° to 109° to the second side, the second side is at an angle of 71° to 109° to the third side, the third side is at an angle of 71° to 109° to the fourth side, and the fourth side is at an angle of 71° to 109° to the first side.

23. The apparatus of claim 21 wherein the region is rectangular in top view, with a ratio of lengths of any two adjacent sides being at least 0.7 and at most 1.45.

24. The apparatus of claim 21 wherein the laser diodes and the optics are arranged to keep the beams separate from each other at least between the laser diodes and the first beam-redirector.

25. The apparatus of claim 21 wherein the output window is an input of an optical fiber.

26. The apparatus of claim 21 wherein the first beam-redirector is for directing the collimated beams to travel adjacent to the third side with the beams' slow axes overlying one another and not lying on a single straight line.

27. The apparatus of claim 21 wherein the first beam-redirector is for directing the collimated beams to travel adjacent to the third side with the beams' slow axes overlying one another and parallel to each other in the vertical cross section transverse to the beams.

28. The apparatus of claim 21 wherein the collimator optics and the first beam redirector are for directing the beams not to overlap when travelling adjacent to the third side.

29. A method for manufacturing the apparatus of claim 21, the method comprising mounting, in said region, the laser diodes and the optics for directing the laser beams.

30. An apparatus disposed in a region having a plurality of vertical sides comprising at least a first side, a second side, a third side, and a fourth side, wherein each of the second and fourth sides is between the first side and the third side, and each of the first and third sides is between the second side and the fourth side, the apparatus comprising:
(1) a plurality of laser diodes arranged to emit laser beams into the region in a direction or directions away from the first side, wherein the laser diodes' emitters are at different distances from at least one of the second and fourth sides; and
(2) optics for directing the laser beams to an output window, the optics comprising:
(2a) collimator optics for collimating the laser beams;
(2b) a first beam-redirector for directing the collimated beams to travel adjacent to the third side with the beams' slow axes overlying one another in a vertical cross section transverse to the beams;
(2c) a second beam-redirector for directing the beams received from the first beam-redirector to travel adjacent to the fourth side; and
(2d) focusing optics for converging the beams traveling from the second redirector to the output window;
a plurality of laser diode structures, each laser diode structure comprising a discrete semiconductor structure comprising one or more of said laser diodes;
a plurality of generally flat, heat-dissipating surface regions for dissipating heat generated by the laser diodes, each laser diode structure being rigidly attached to a corresponding one of the flat, heat dissipating surface regions;
wherein each laser diode structure is associated with a portion of the collimating optics and the first beam-redirector for collimating and directing the beam or beams emitted by the laser diode structure, the portion being rigidly attached to the corresponding flat, heat-dissipating surface region, wherein the portions being spaced from each other.

31. An apparatus comprising:
(1) a plurality of laser diodes arranged to emit laser beams whose optical axes do not overlie each other;
(2) optics for directing the laser beams to an output window, the optics comprising:
(2a) collimator optics for providing a plurality of collimated beams, each collimated beam being produced by collimating a corresponding beam emitted by the laser diodes;
(2b) a first beam-redirector for turning each collimated beam in a direction positioned in top view at an angle of 71° to 109° to the optical axis of the corresponding beam emitted by the laser diodes, and for positioning the beams' slow axes to overlie one another in a vertical cross section transverse to the beams;
(2c) a second beam-redirector for turning the beams received from the first beam-redirector, wherein in top view the beams entering the second beam-redirector form an angle or angles of 71° to 109° to the beams emerging from the second beam-redirector; and
(2d) focusing optics for converging the beams traveling from the second redirector to the output window;
wherein in a first vertical cross section transverse to the beams and located at an entrance to the first beam-redirector, the beams' slow axes do not overlie one another or, if any slow axes overlie one another, an overlap between such slow axes is smaller than in a second cross section orthogonal to the beams exiting the first beam-redirector.

32. The apparatus of claim 31 wherein the laser diodes and the optics are arranged to keep the beams separate from each other at least between the laser diodes and the first beam-redirector.

33. The apparatus of claim 31 comprising:
a plurality of laser diode structures, each laser diode structure comprising a discrete semiconductor structure comprising one or more of said laser diodes;
a plurality of generally flat, heat-dissipating surface regions for dissipating heat generated by the laser diodes, each laser diode structure being rigidly attached to a corresponding one of the flat, heat dissipating surface regions;
wherein each laser diode structure is associated with a portion of the collimating optics and the first beam-redirector for collimating and directing the beam or beams emitted by the laser diode structure, the portion being rigidly attached to the corresponding flat, heat-dissipating surface region, wherein the portions being spaced from each other.

34. The apparatus of claim 31 wherein the output window is an input of an optical fiber.

35. The apparatus of claim 31 wherein the first beam-redirector and the second beam redirector are for turning each collimated beam in a direction positioned in top view at a combined angle of 71°+71°=142° to 109°+109°=218° relative to the optical axis of the corresponding beam emitted by the diodes.

36. The apparatus of claim 31 wherein the collimator optics and the first beam redirector are for directing the beams not to overlap at least until entering the second beam-redirector.

37. A method for manufacturing the apparatus of claim 31, the method comprising:
- arranging the laser diodes to emit laser beams whose optical axes do not overlie each other; and
- arranging the optics for directing the laser beams to provide the collimated beams, to turn each collimated beam by the first beam-redirector, to turn the beams received from the first beam-redirector by the second beam-redirector, and to converge the beams travelling from the second redirector by the focusing optics.

38. An apparatus comprising:
(1) a plurality of laser diodes arranged to emit laser beams whose optical axes do not overlie each other;
(2) optics for directing the laser beams to an output window, the optics comprising:
(2a) collimator optics for providing a plurality of collimated beams, each collimated beam being produced by collimating a corresponding beam emitted by the laser diodes;
(2b) a first beam-redirector for turning each collimated beam in a direction positioned in top view at an angle of 71° to 109° to the optical axis of the corresponding beam emitted by the laser diodes, and for positioning the beams' slow axes to overlie one another in a vertical cross section transverse to the beams;
(2c) a second beam-redirector for turning the beams received from the first beam-redirector, wherein in top view the beams entering the second beam-redirector form an angle or angles of 71° to 109° to the beams emerging from the second beam-redirector; and
(2d) focusing optics for converging the beams traveling from the second redirector to the output window;
wherein in top view, for each said beam, the beam's path to the first redirector, the beam's path from the first redirector to the second redirector, and the beam's path between the second redirector and the output window are arranged on third sides of a rectangle, and in the largest of said rectangles, a ratio of lengths of any two adjacent sides is at least 0.7 and at most 1.45.

* * * * *